(12) United States Patent
Hembree

(10) Patent No.: US 6,504,389 B1
(45) Date of Patent: Jan. 7, 2003

(54) TEST CARRIER FOR PACKAGING SEMICONDUCTOR COMPONENTS HAVING CONTACT BALLS AND CALIBRATION CARRIER FOR CALIBRATING SEMICONDUCTOR TEST SYSTEMS

(75) Inventor: David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 2 days.

(21) Appl. No.: 09/621,121

(22) Filed: Jul. 21, 2000

Related U.S. Application Data

(62) Division of application No. 09/146,715, filed on Sep. 3, 1998, now Pat. No. 6,208,156.

(51) Int. Cl.[7] .................. G01R 31/02; G01R 31/26
(52) U.S. Cl. .................. 324/755; 324/757; 324/765
(58) Field of Search .................. 324/755, 764, 324/757, 765, 158.1

(56) References Cited

U.S. PATENT DOCUMENTS

| | | | |
|---|---|---|---|
| 5,239,198 A | 8/1993 | Lin et al. | |
| 5,468,999 A | 11/1995 | Lin et al. | |
| 5,537,051 A | 7/1996 | Jalloul et al. | |
| 5,578,870 A | 11/1996 | Farnsworth et al. | |
| 5,607,818 A | * 3/1997 | Akram et al. | 430/311 |
| 5,669,774 A | 9/1997 | Grabbe | |
| 5,674,785 A | 10/1997 | Akram et al. | |
| 5,686,317 A | * 11/1997 | Akram et al. | 29/846 |
| 5,691,649 A | 11/1997 | Farnworth et al. | |
| 5,783,461 A | 7/1998 | Hembree | |
| 5,834,945 A | 11/1998 | Akram et al. | |
| 5,915,977 A | 6/1999 | Hembree et al. | |
| 5,931,685 A | 8/1999 | Hembree et al. | |
| 5,949,242 A | 9/1999 | Wood et al. | |
| 5,962,921 A | 10/1999 | Farnworth et al. | |
| 5,982,185 A | 11/1999 | Farnworth | |
| 6,016,060 A | 1/2000 | Akram et al. | |
| 6,025,730 A | 2/2000 | Akram et al. | |
| 6,040,239 A | 3/2000 | Akram et al. | |
| 6,040,702 A | * 3/2000 | Hembree et al. | 324/755 |
| 6,072,326 A | * 6/2000 | Akram et al. | 324/755 |

(List continued on next page.)

OTHER PUBLICATIONS

Plastronics Socket Co., Inc., "Socketalk", brochure, Apr. 1996, pp. 1–6.

*Primary Examiner*—Michael Sherry
*Assistant Examiner*—Jermele M. Hollington
(74) *Attorney, Agent, or Firm*—Stephen A. Gratton

(57) ABSTRACT

A test carrier for testing bumped semiconductor components such dice, chip scale packages, BGA devices, and wafers is provided. The test carrier includes a base for retaining one or more components and contact members for making temporary electrical connections with contact balls on the components (e.g., solder balls). The test carrier also includes terminal contacts formed as hard metal balls, as hard metal balls coated with a non-oxidizing metal layer, or as glass, ceramic or plastic members coated with a conductive material. The contact members on the base protect the contact balls on the components from deformation during testing and handling. The terminal contacts on the test carrier are configured for multiple uses in a production environment without deformation.

Also provided is a calibration carrier for calibrating semiconductor test systems for bumped components, and a cleaning carrier for cleaning test sockets for bumped components. The calibration carrier can include on board evaluation circuitry for evaluating electrical characteristics of a test system, such as contact resistances between electrical connectors of a test socket and terminal contacts on the calibration carrier. The cleaning carrier includes terminal contacts formed of a solder wettable material configured to attract solder contaminants in test sockets.

19 Claims, 9 Drawing Sheets

U.S. PATENT DOCUMENTS

| | | |
|---|---|---|
| 6,094,058 A | 8/2000 | Hembree et al. |
| 6,103,613 A * | 8/2000 | Akram ....................... 438/597 |
| 6,107,109 A | 8/2000 | Akram et al. |
| 6,114,240 A | 9/2000 | Akram et al. |
| 6,130,148 A | 10/2000 | Farnworth et al. |
| 6,208,156 B1 * | 3/2001 | Hembree .................... 324/755 |
| 6,222,379 B1 * | 4/2001 | Farnworth et al. .......... 324/755 |

* cited by examiner

```
┌─────────────────────────────────────────┐
│ PROVIDE CALIBRATION CARRIER 42CA HAVING │
│     HARD METAL TERMINAL CONTACTS 58CA   │
│         AND SEMICONDUCTOR DIE 110.      │
└─────────────────────────────────────────┘
                    │
┌─────────────────────────────────────────┐
│    PLACE CALIBRATION CARRIER 42CA IN TEST │
│       SOCKET 60C OF TEST SYSTEM 102C TO   │
│     SIMULATE CONVENTIONAL COMPONENT UNDER │
│         TEST HAVING SOLDER BALLS.         │
└─────────────────────────────────────────┘
                    │
┌─────────────────────────────────────────┐
│  TRANSMIT TEST SIGNALS AND ANALYZE RESULTANT │
│       SIGNALS FROM SEMICONDUCTOR DIE 110  │
│     CONTAINED IN CALIBRATION CARRIER 42CA.│
└─────────────────────────────────────────┘
                    │
┌─────────────────────────────────────────┐
│ USE THIS DATA AS A "STANDARD" FOR CALIBRATING │
│   TEST SYSTEM 102C OR TO INDICATE DEFECTIVE │
│       ELECTRICAL CONNECTORS 106, 108.    │
└─────────────────────────────────────────┘
                    │
┌─────────────────────────────────────────┐
│     OPTIONALLY, PROVIDE EVALUATION CIRCUITS │
│       126B, 126D, ON CALIBRATION CARRIER 42CA, │
│   SUCH AS RESISTIVITY MEASURING CIRCUIT 128. │
└─────────────────────────────────────────┘
                    │
┌─────────────────────────────────────────┐
│       EVALUATE ELECTRICAL CHARACTERISTICS, │
│    SUCH AS CONTACT RESISTANCE BETWEEN TEST │
│      SOCKET 60C AND TERMINAL CONTACTS 58CA, │
│       USING EVALUATION CIRCUITS 126B, 126D. │
└─────────────────────────────────────────┘
                    │
┌─────────────────────────────────────────┐
│       ADJUST TEST SIGNALS, OR CLEAN AND  │
│   REPAIR TEST SOCKET, BASED ON EVALUATION.│
└─────────────────────────────────────────┘
```

FIGURE 8B

TEST CARRIER FOR PACKAGING SEMICONDUCTOR COMPONENTS HAVING CONTACT BALLS AND CALIBRATION CARRIER FOR CALIBRATING SEMICONDUCTOR TEST SYSTEMS

CROSS REFERENCE TO RELATED APPLICATIONS

This application is a division of application Ser. No. 09/146,715, filed on Sep. 3, 1998, now U.S. Pat. No. 6,208,156 B1.

FIELD OF THE INVENTION

This invention relates generally to the manufacture and testing of semiconductor components. More particularly, this invention relates to systems and carriers for testing bumped semiconductor components such as bare semiconductor dice, chip scale packages, BGA devices, and semiconductor wafers, having contact balls.

BACKGROUND OF THE INVENTION

Semiconductor components, such as bare dice, chip scale packages, BGA devices and wafers can include terminal contacts in the form of contact balls. This type of component is sometimes referred to as a "bumped" component (e.g., bumped die, bumped wafer).

The contact balls provide a high input/output capability for a component, and permit the component to be surface mounted, or alternately flip chip mounted, to a mating substrate, such as a printed circuit board (PCB). Typically, the contact balls comprise solder, which permits bonding to the mating substrate using a solder reflow process. For some components, such as chip scale packages and BGA devices, the contact balls can be arranged in a dense array, such as a ball grid array (BGA), or a fine ball grid array (FBGA).

One problem with solder contact balls is that solder is a relatively soft material, and the balls deform easily during handling and testing of the components. During testing, the component is typically inserted into a test socket having electrical connectors, such as spring loaded pins (e.g., "POGO PINS"), that electrically engage the contact balls. Because solder is a soft material, the electrical connectors on the test socket can deform the contact balls on the components. This problem is compounded during testing at elevated temperatures, such as burn-in testing, as heating further softens the solder.

For performing subsequent test procedures, it may be difficult to make low resistance electrical connections with deformed contact balls. In particular, the electrical connectors on the test apparatus may not adequately engage the surfaces of the contact balls. Also, for subsequent bonding procedures, deformed balls can make alignment and bonding of the component with a mating substrate more difficult to perform. In addition, deformed contact balls are a cosmetic problem that can affect a users perception of a semiconductor component.

In addition to making electrical connections for test procedures more difficult, deformed contact balls can alter test results by affecting electrical characteristics, such as contact resistance, inductance, and signal speed during the test procedure. Further, solder readily oxidizes, which adds resistance to the electrical connections with the contact balls.

Another problem with solder contact balls is the adverse affect that solder can have on a semiconductor test system. For example, solder flakes can break loose from the balls, contaminating test sockets, and other electrical components associated with the test system. This can change the calibration of the test system and affect test results on all of the components being tested. In addition, solder is a contaminant to other semiconductor fabrication processes, and its presence requires special handling and segregation of the components. For some components, technicians may be required to wear gloves, and other protective clothing, to prevent lead from being deposited on their skin.

In view of the foregoing, it would be advantageous to provide a test carrier for temporarily packaging bumped semiconductor components in which contact balls on the components are protected during test procedures. In addition, it would be advantageous to provide a calibration carrier for calibrating, and a cleaning carrier for cleaning, test systems for bumped semiconductor components.

SUMMARY OF THE INVENTION

In accordance with the present invention, an improved test carrier for temporarily packaging bumped semiconductor components having contact balls is provided. Also provided are an improved method for testing semiconductor components using the test carrier, and an improved test system which incorporates the test carrier. In an alternate embodiment of the invention a calibration carrier for calibrating test systems for bumped semiconductor components is provided. In another alternate embodiment of the invention, a cleaning carrier for removing solder contaminants from test systems for bumped semiconductor components is provided.

The test carrier, simply stated, comprises: a base for retaining one or more components for testing; an alignment member for aligning the components on the base; and a force applying mechanism for biasing the components against the base. The base includes contact members configured for electrical communication with contact balls on the components. The contact members on the base comprise recesses covered with a conductive layer having either sharp edges or blades, for penetrating the contact balls.

The base also includes terminal contacts and conductive vias in electrical communication with the contact members. The terminal contacts are configured for electrical communication with a test socket of a test system. The terminal contacts can comprise hard metal balls, hard metal balls covered with non-oxidizing metal layers, or glass, ceramic or plastic members covered with a conductive material.

The test carrier can be configured for testing bare dice, chip scale packages, BGA devices, or wafers. During test procedures using the test carrier, the contact members on the base make low resistance electrical connections with the contact balls on the components, and protect the contact balls from deformation. In addition, the terminal contacts on the base make low resistance electrical connections with electrical connectors of a test socket, and resist wear, deformation, and oxide build up even with continued usage in a production environment.

The calibration carrier comprises a base having terminal contacts, and a semiconductor die mounted to the base in electrical communication with the terminal contacts. As with the test carrier, the terminal contacts can comprise hard metal balls, hard metal balls covered with non-oxidizing metal layers, or glass, ceramic or plastic balls covered with a conductive material. The calibration carrier is configured for placement in a test socket of a test system to simulate a conventional semiconductor component having solder contact balls. The calibration carrier can be used to calibrate the test system, and to locate defective electrical connectors on the test socket. The calibration carrier can also include on board circuitry for evaluating electrical characteristics of the test system, such as contact resistance between the terminal contacts on the carrier, and the electrical connectors on the test socket.

The cleaning carrier comprises a base having terminal contacts formed of a solder wettable metal such as pressed and sintered metal balls, braided metal wires, or metal bristles. The cleaning carrier can be heated and placed into a socket of a test system, with the terminal contacts on the carrier in physical contact with electrical connectors on the test socket. Solder contaminants within the socket are attracted to the terminal contacts, and can be removed with the cleaning carrier. The cleaning carrier can also include an on board heating element for heating the terminal contacts.

BRIEF DESCRIPTION OF THE DRAWINGS

FIG. 8B is a block diagram illustrating steps in a method for calibrating a test system using the calibration carrier of FIG. 8;

DETAILED DESCRIPTION OF THE PREFERRED EMBODIMENTS

Referring to FIGS. 1A—1D, 2, and 3, various prior art semiconductor components having contact balls 10 are illustrated.

Figure 1A:
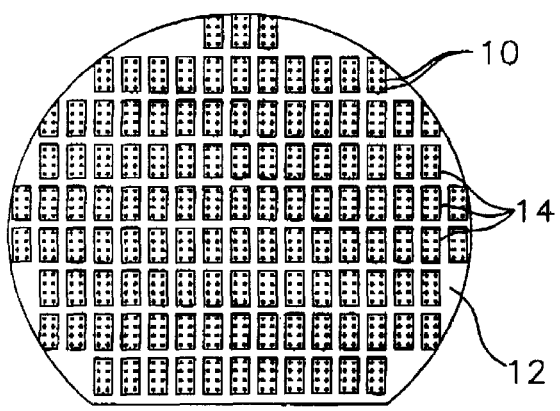
FIG. 1A is a schematic plan view of a prior art bumped semiconductor wafer.
Figure 1B:
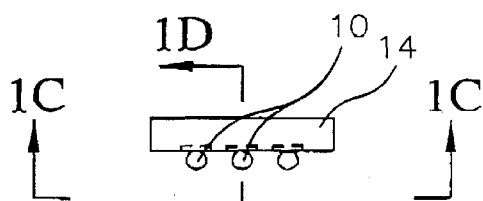
FIG. 1B is an enlarged schematic side elevation view of a bumped die which has been separated from the wafer.

In FIG. 1A, a semiconductor wafer 12 comprises a plurality of semiconductor dice 14. FIG. 1B illustrates a die 14 that has been separated from the wafer 12. Each die 14 includes a plurality of contact balls 10. As will be further explained, test carriers can be constructed in accordance with the invention for testing either the wafer 12, or the die 14.

Figure 1D:
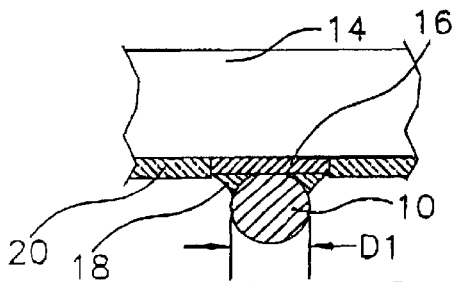
FIG. 1D is an enlarged cross sectional view taken along section line 1D—1D of FIG. 1B showing a contact ball bonded to a bonding site on the die.
Figure 1C:
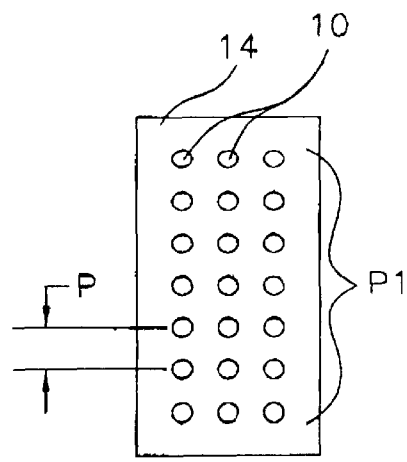
FIG. 1C is a schematic bottom view of the die taken along section line 1C—1C of FIG. 1B.

As shown in FIG. 1C, the contact balls 10 are formed on the die 14 in a pattern P1. In the illustrative embodiment, the pattern P1 is a dense grid array, such as a ball grid array (BGA). By way of example, a representative diameter D1 for the contact balls 10 can be about 0.005-in (0.127 mm) to 0.050-in (1.270 mm) or greater. A representative pitch P (center to center spacing) of the contact balls 10 can be from about 0.008-in (0.228 mm) to about 0.060-in (1.524 mm) or greater.

The die 14 also includes a plurality of bonding sites for attaching the contact balls 10 to the die 14. FIG. 1D illustrates one example for a bonding site 16 in the form of a thin film aluminum bond pad embedded in a passivation layer 20. FIG. 1D also illustrates a single ball 10 that has been bonded to the bonding site 16 on the die 14 using a solder flux 18.

Figure 2:
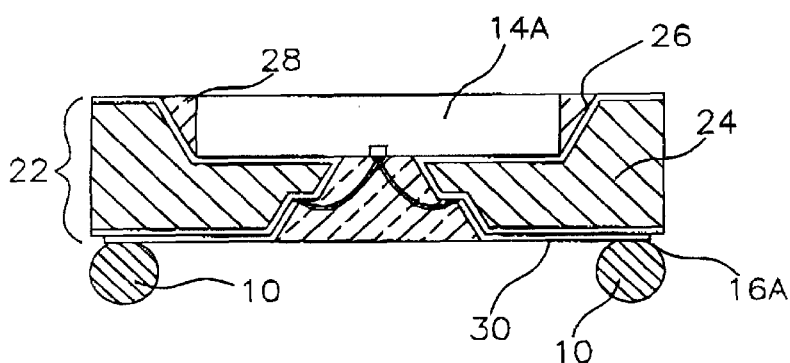
FIG. 2 is an enlarged schematic cross sectional view of a prior art chip scale package having contact balls.

FIG. 2 illustrates another prior art semiconductor component in the form of a chip scale package 22. The chip scale package 22 includes a silicon body 24 having a recess 26 wherein a semiconductor die 14A is held by an encapsulant 28. The package 22 also includes conductors 30 wire bonded to the die 14A. The conductors 30 include bonding sites 16A for the balls 10. Further details of the chip scale package 22 are described in U.S. Pat. No. 5,674,785 to Akram et al.

entitled "Method Of Producing A Single Piece Package For Semiconductor Die", and in U.S. Pat. No. 5,739,585, to Akram et al. entitled "Single Piece Package For Semiconductor Die", both of which are incorporated herein by reference.

Figure 3:
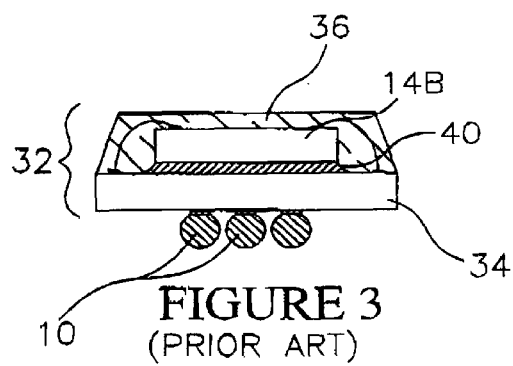
FIG. 3 is an enlarged schematic cross sectional view of a prior art BGA device having contact balls.

FIG. 3 illustrates another prior art component in the form of a BGA device 32. The BGA device 32 includes a semiconductor die 14B, and a BGA substrate 34. The die 14B is wire bonded to the BGA substrate 34 in electrical communication with contact balls 10 on the BGA substrate 34. In addition, an adhesive layer 40 attaches the BGA substrate 34 to the die 14B, and an encapsulant 36 covers the die 14B and associated wire bonds.

As will be further explained, a test carrier can be constructed in accordance with the invention for testing chip scale package 22, or BGA device 32, as well as other types of semiconductor packages having contact balls 10.

Figure 4A:
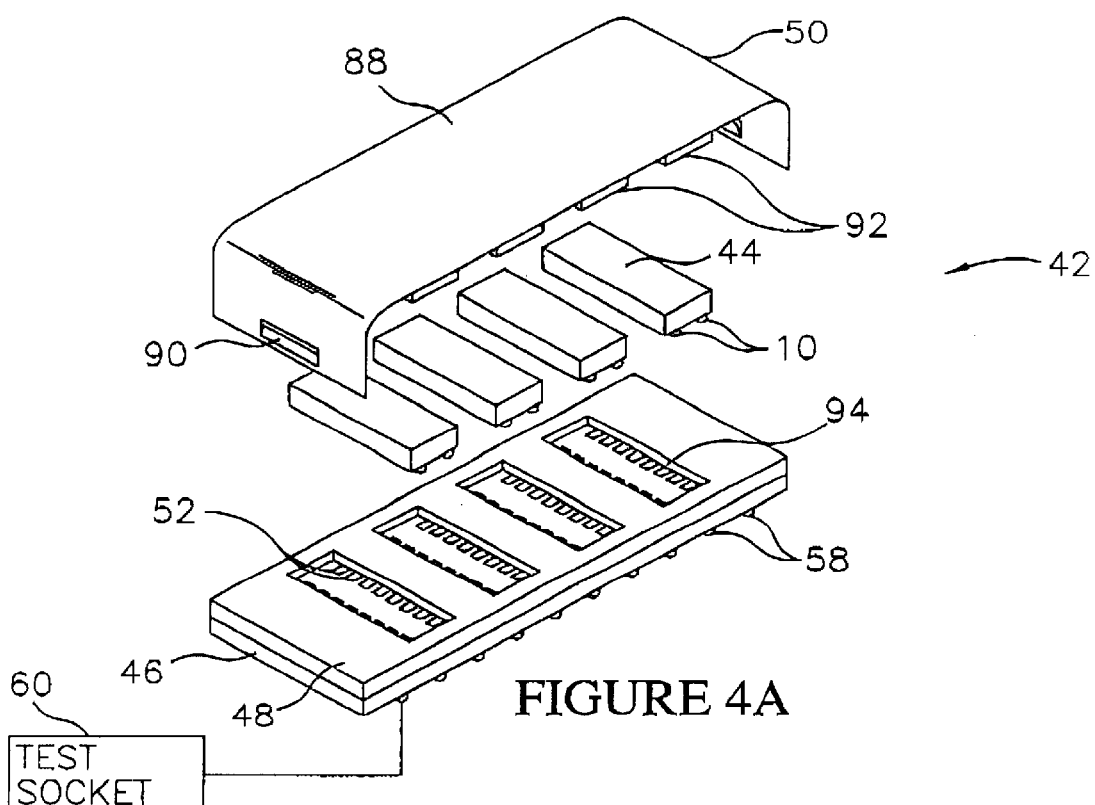
FIG. 4A is an exploded schematic perspective view of a test carrier constructed in accordance with the invention for testing bumped semiconductor dice, chip scale packages or BGA devices.
Figure 4B:
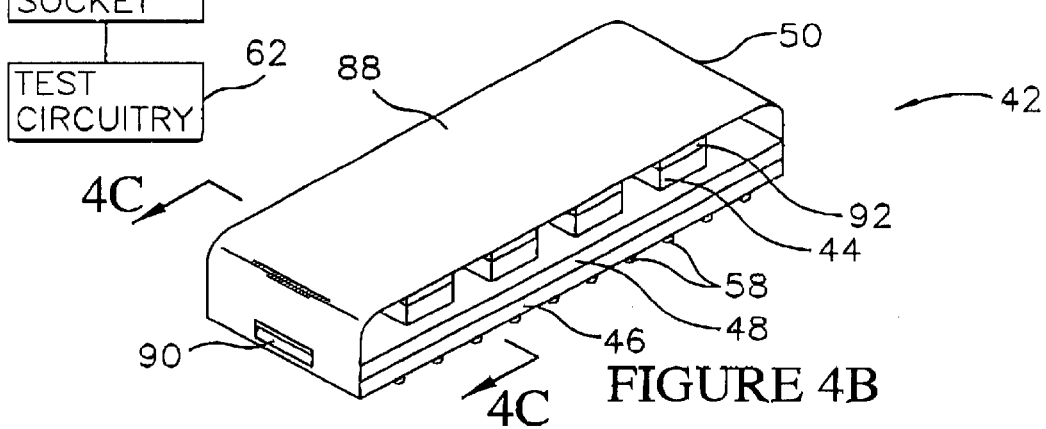
FIG. 4B is a schematic perspective view of the assembled test carrier of FIG. 4A.

Referring to FIGS. 4A and 4B, a test carrier 42 constructed in accordance with the invention is illustrated. The test carrier 42 is configured to temporarily package multiple semiconductor components 44 having contact balls 10. The semiconductor components 44 can comprise bumped dice 14 (FIG. 1B), chip scale packages 22 (FIG. 2), or BGA devices 32 (FIG. 3).

The test carrier 42 comprises: a base 46 for retaining and electrically contacting the components 44; an alignment member 48 for aligning the components 44 on the base 46; and a force applying mechanism 50 for biasing the components 44 against the base 46.

The base 46 can comprise ceramic, plastic, polyimide, glass filled resin (FR-4), photo sensitive glass, or a semiconducting material, such as silicon. The base 46 includes terminal contacts 58 configured for mating electrical engagement with a test apparatus, such as a test socket 60 on a burn-in board (not shown). The test socket 60 is in electrical communication with test circuitry 62. The test circuitry 62 is configured to apply test signals to the integrated circuits contained on the components 44 and to analyze the resultant signals.

Figure 4C:
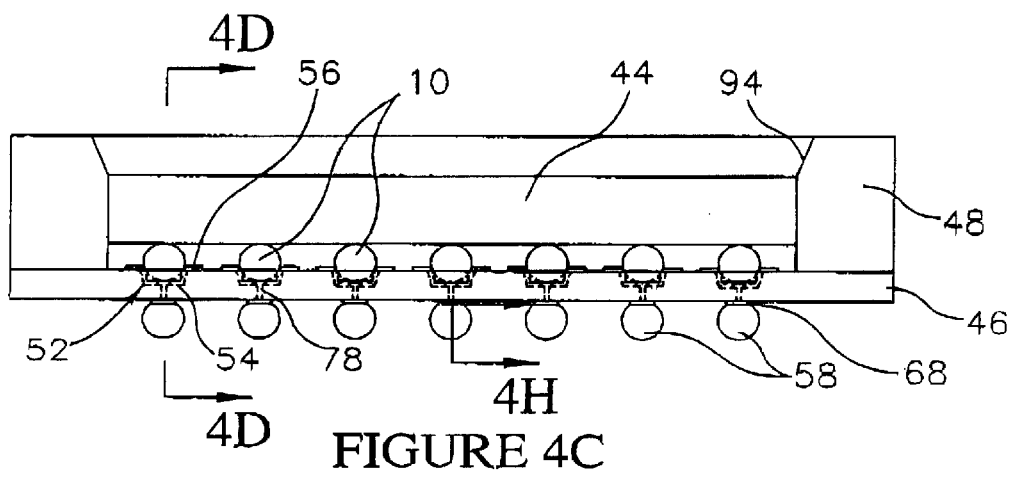
FIG. 4C is a cross sectional view of the assembled test carrier, with parts removed, taken along section line 4C—4C of FIG. 4B.
Figure 4E:
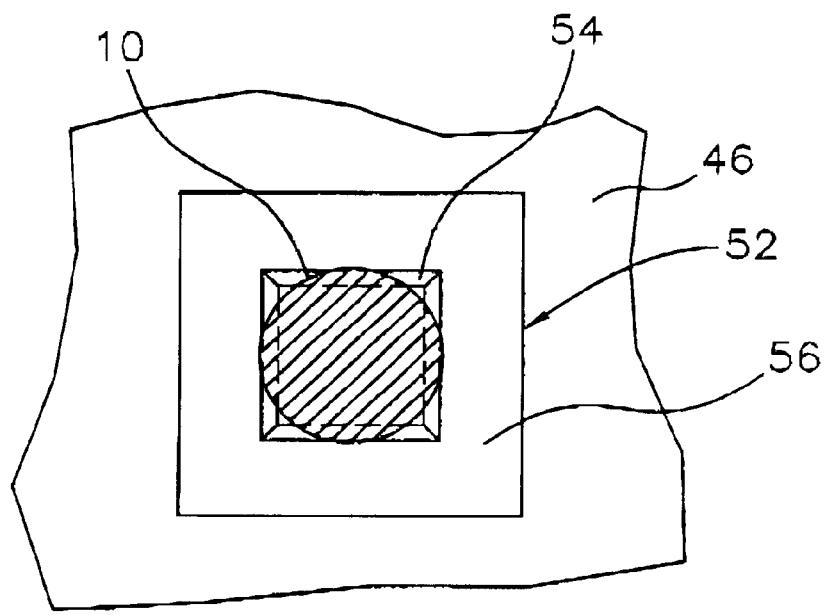
FIG. 4E is an enlarged cross sectional view taken along section line 4E—4E of FIG. 4D.
Figure 4D:
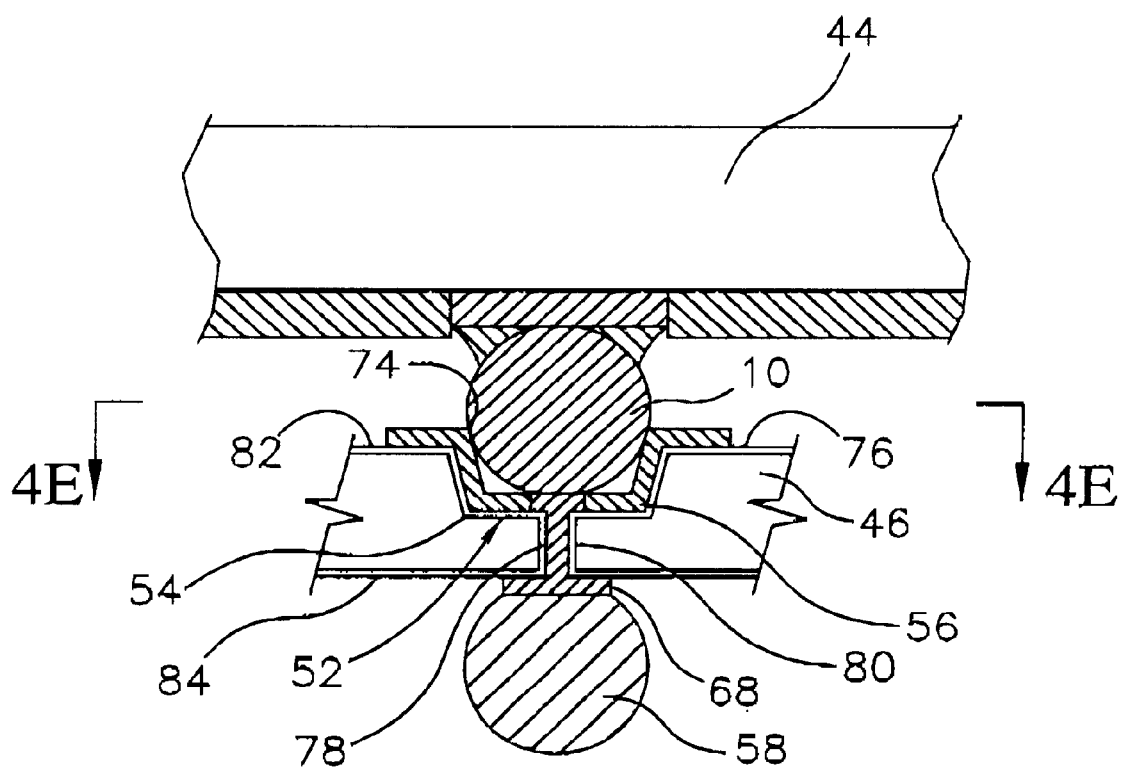
FIG. 4D is an enlarged cross sectional view taken along section line 4D—4D of FIG. 4C showing a contact member on a base of the test carrier electrically engaging a contact ball on a component temporarily packaged in the carrier.
Figure 4G:
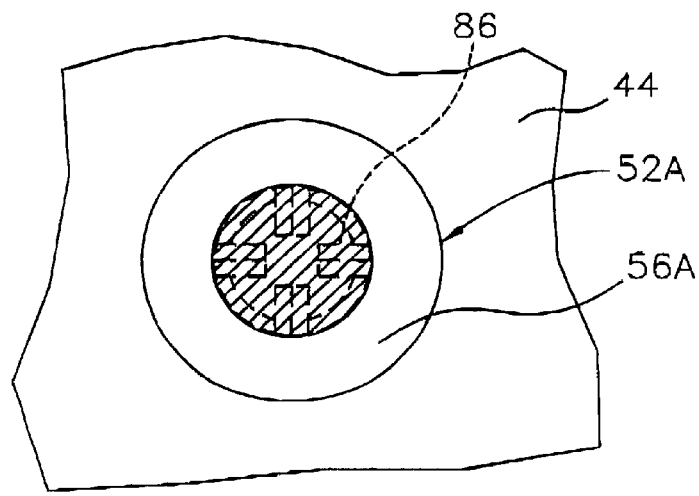
FIG. 4G is an enlarged cross sectional view taken along section line 4G—4G of FIG. 4F.
Figure 4F:
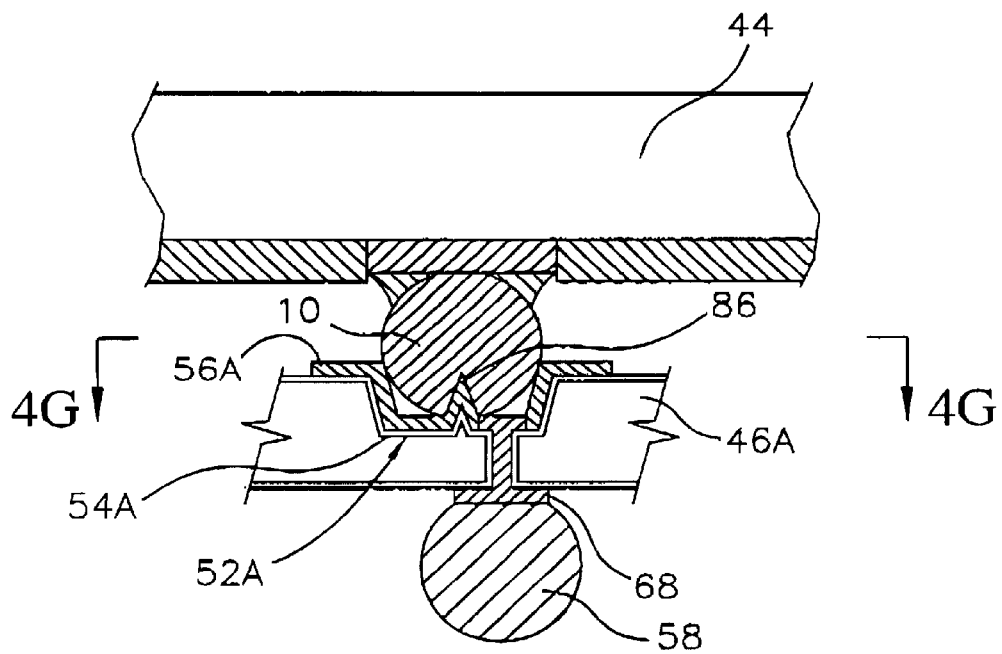
FIG. 4F is an enlarged cross sectional view equivalent to FIG. 4D of an alternate embodiment contact member.
Figure 4H:
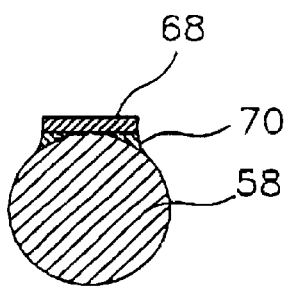
FIG. 4H is a cross sectional view taken along section line 4H—4H of FIG. 4C illustrating a terminal contact on the base of the test carrier.

As shown in FIG. 4H, the terminal contacts 58 can comprise generally spherically shaped balls, formed of a hard, wear resistant metal. A diameter and pitch of the terminal contacts 58 can match the diameter and pitch of conventional solder balls, such as the contact balls 10 (FIG. 1D) previously described. However, because the terminal contacts 58 comprise a hard metal rather than solder, deformation, oxide build up, and contamination from solder flakes is substantially reduced. Suitable metals for forming the terminal contacts 58 include copper, alloys of copper, beryllium copper, alloys of beryllium copper, nickel, alloys of nickel, nickel-cobalt-iron alloys, and iron-nickel alloys.

The terminal contacts 58 can be formed separately, and then attached to contact pads 68 on the base 46. For example, pre-fabricated metal balls are manufactured by Mitsui Comtek Corp. of Saratoga, Calif. under the trademark "SENJU SPARKLE BALLS". The metal balls can be attached to the contact pads 68 by soldering, laser reflowing, brazing, welding, or applying a conductive adhesive. A solder ball bumper can also be used to bond the terminal contacts 58 to the contact pads 68. A suitable solder ball bumper is manufactured by Pac Tech Packaging Technologies of Falkensee, Germany. The terminal contacts 58 can also be formed on the contact pads 68 using a conventional wire bonder apparatus adapted to form a ball bond, and then to sever the attached wire. Further, the terminal contacts 58 can be formed by electrolytic deposition or electroless deposition of a metal to form bumps. In FIG. 4H, the terminal contacts 58 are soldered, and solder fillets 70 attach the terminal contacts 58 to the contact pads 68.

Figure 4I:
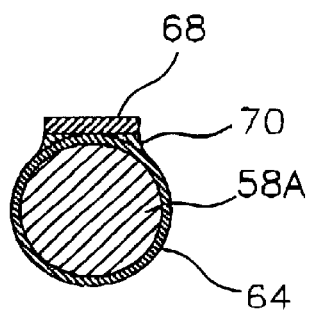
FIG. 4I is a cross sectional view equivalent to FIG. 4H illustrating an alternate embodiment terminal contact.

Alternately, as shown in FIG. 4I, the terminal contacts 58A can comprise a base metal coated with non-oxidizing metal layers 64. The non-oxidizing metal layers allow low resistance electrical connections to be made with the terminal contacts 58A as the formation of oxide layers on the terminal contacts 58A is substantially reduced. Suitable metals for forming the non-oxidizing metal layers 64 include gold, silver and palladium. The non-oxidizing metal layers 64 can be formed using a deposition process such as electroless deposition, electrolytic deposition, or CVD. As also shown in FIG. 4I, solder fillets 70 attach the terminal contacts 58A to the contact pads 68.

Figure 4J:
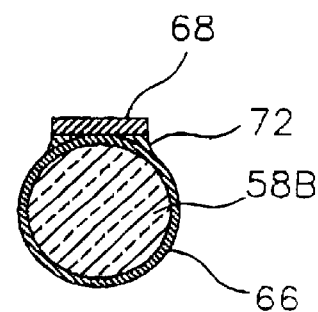
FIG. 4J is a cross sectional view equivalent to FIG. 4H illustrating another alternate embodiment terminal contact.

Alternately, as shown in FIG. 4J, each terminal contact 58B can comprise a glass, ceramic or plastic member shaped as a sphere, or as a bullet, and coated with a hard, wear resistant conductive layer 66. Glass spheres and bullets are commercially available from Cataphote, Inc. of Jackson, MS. Suitable materials for the conductive layer 66 include the above identified metals for the terminal contacts 58 and for the non-oxidizing metal layers 64. The conductive layer 66 can be formed using a plating process, such as electroless or electrolytic plating, a deposition process such as CVD, sputtering or evaporation, a molding process, or a lamination process. As also shown in FIG. 4J, conductive adhesive fillets 72 attach the terminal contacts 58B to the contact pads 68. Suitable conductive adhesives are sold by A.I. Technology, Trenton, N.J.; Sheldahl, Northfield, Minn.; and 3M St. Paul, Minn.

Referring again to FIG. 4C, in addition to the terminal contacts 58, the base 46 includes multiple patterns of contact members 52 in electrical communication with the terminal contacts 58. The contact members 52 are configured to retain and electrically engage the contact balls 10 on the components 44. In order to perform this function, a pattern of the contact members 52 exactly matches a pattern (e.g., P1-FIG. 1C) of the contact balls 10. In the illustrative embodiment the contact members 52 are formed directly on the base 46. However, it is to be understood that the contact members 52 can also be formed on a separate member such as an interconnect which is attached to the base 46.

Referring to FIGS. 4D and 4E, further details of the contact members 52 are illustrated. Each contact member 52 comprises a recess 54, at least partially covered with a conductive layer 56. Each recess 54 is sized and shape to retain and electrically engage a contact ball 10. In addition, each recess 54 includes sloped sidewalls for guiding and aligning the contact ball 10.

The recesses 54 for the contact members 52 can be formed by etching or laser machining the base 46. With the base 46 comprising silicon, the recesses 54 can be etched using a mask (not shown) and a suitable wet etchant such as KOH:H$_2$O or TMAH. With the base 46 comprising ceramic, the recesses 54 can be etched using a mask (not shown) and a suitable wet etchant such as HF, or alternately using an ion milling process. With the base 46 comprising photosensitive glass, the recesses 54 can be etched using a mask (not shown) and a suitable wet etchant such as HF. In addition, photosensitive glasses and etchants are commercially available from Dow Corning under the trademark "FOTOFORM". With the base 46 comprising plastic or glass filled resin, the recesses 54 can be formed using a molding or lamination process.

As also shown in FIG. 4D, with the base 46 comprising silicon, an insulating layer 76 can be formed on exposed surfaces of the base 46 to electrically insulate the conductive layer 56, the contact pads 68, and conductive vias 78 to be hereinafter described, from a remainder of the base 46. If the base 46 comprises an electrically non-conductive material such as ceramic, plastic, glass filled resin, or photosensitive glass the insulating layer 76 is not required.

The insulating layer 76 can be a material, such as $SiO_2$, or $Si_3N_4$, deposited to a desired thickness using CVD, or other deposition process. The insulating layer 76 can also be a polymer, such as polyimide, deposited and planarized using a suitable process (e.g., spin-on-process).

Following formation of the insulating layer 76, the conductive layers 56 can be formed on an inner surface 82 of the base 46 and within the recesses 54. Peripheral edges 74 of the conductive layers 56 are adapted to penetrate native oxide layers on the contact balls 10 to contact the underlying metal. The conductive layers 56 can be formed as a layer of a highly conductive metal such as aluminum, titanium, nickel, iridium, copper, gold, tungsten, silver, platinum, palladium, tantalum, molybdenum or alloys of these metals. Rather than being a single layer of metal, the conductive layers 56 can be formed as multi-layered stacks of metals (e.g., bonding layer/barrier layer).

The conductive layers 56 can be formed using a metallization process (e.g., deposition, photopatterning, etching). An exemplary metallization process is disclosed in U.S. Pat. No. 5,607,818, incorporated herein by reference. The conductive layers 56 can also be formed using a plating process, such as electrolytic deposition, or electroless deposition. A representative thickness of the conductive layers 56 is from 600Å to 20000Å.

Instead of the above metals, the conductive layers 56 can also comprise a metal silicide, such as $TiSi_2$, $WSi_2$, $TaSi_2$, $MoSi_2$, and $PtSi_2$. In this case, a silicon containing layer and a metal layer can be deposited on the base 46, and then reacted to form a metal silicide. An exemplary metal silicide deposition process is disclosed in U.S. Pat. No. 5,686,317, incorporated herein by reference. Still further, other alloys such as TiN, TiW, TiC and NiB can be deposited using CVD or other deposition process.

Still referring to FIG. 4D, following formation of the conductive layers 56, openings 80 can-be formed-through the conductive layers 56, and through the base 46 to an outer surface 84 thereof. One method for forming the openings 80 comprises a laser machining process. Such a process is described in U.S. Patent Appilcation No. 08/993,965, filed Dec. 10, 1997, U.S. Pat. No. 6,107,109, entitled "Semiconductor Interconnect Having Laser Machined Contacts", which is incorporated herein by reference.

Following formation of the openings 80 the insulating layer 76, as previously described can be formed within the openings 80. In addition, the conductive vias 78 can be formed within the openings 80. The conductive vias 78 can comprise a metal, such as the previously described metals for the conductive layers 56. The metal can be deposited within the openings 80 using a deposition process, such as CVD, electrolytic deposition or electroless deposition. A solder metal can be screen printed in the openings 80, as well as with capillary action, or with a vacuum system using a hot solder wave. In addition, the conductive vias 78 can be plugs that completely fill the openings 80, or alternately can be layers that cover just the inside surfaces or sidewalls of the openings 80.

Rather than being a metal, the conductive vias 78 can comprise a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn.

The conductive vias 78 are formed within the openings 80 in electrical contact with the conductive layers 56. In addition, the conductive vias 78 are in electrical contact with the contact pads 68 and terminal contacts 58. The contact pads 68 can be formed during formation of the conductive vias 78 using a suitable mask (not shown), such as a hard mask, or a stencil mask. Alternately the contact pads 68 can comprise a different material than the conductive vias 78, and can be formed using a separate deposition process.

Referring to FIGS. 4F and 4G, an alternate embodiment contact member 52A is illustrated. The contact member 52A includes a sharp blade 86 configured to penetrate the contact ball 10 and electrically engage the underlying metal. One method for forming the contact member 52A is to etch a recess 54A and a blade 86 on a base 46A formed of silicon. Following etching of the recess 54A and blade 86, both can be covered with a conductive layer 56A, substantially as previously described.

Other types of contact members configured to make non-bonded, temporary electrical connections with contact balls 10 are described in the following U.S. Pat. Applications, which are incorporated herein by reference:

U.S. patent application Ser. No. 08/829,193, now U.S. Pat. No. 5,962,921, entitled "Interconnect Having Recessed Contact Members With Penetrating Blades For Testing Semiconductor Dice And Packages With Contact Bumps";

U.S. patent application Ser. No. 08/823,490, now U.S. Pat. No. 6,016,060, entitled "Method, Apparatus And System For Testing Bumped Semiconductor Components"; and U.S. patent application Ser. No. 08/867,551, now U.S. Pat. No. 5,931,685, entitled "Interconnect For Making Temporary Electrical Connections With Bumped Semiconductor Components.

Referring again to FIG. 4A, the force applying mechanism 50 comprises a bridge clamp 88, and a plurality of elastomeric spring members 92. The bridge clamp 88 includes latch members 90 that attach to the base 46. In the assembled carrier 42 shown in FIG. 4B, the spring members 92 bias the components 44 against the base, such that the contact balls 10 maintain electrical contact with the contact members 52. The elastomeric spring members 92 can be formed of a material such as silicone, butyl rubber, or fluorosilicone. The elastomeric spring members 92 can be secured to the bridge clamp 88 using an adhesive such as silicone.

Rather than being formed of elastomeric materials, the spring members can be formed of metal, or as compressible gas filled bladders. Different types of gas filled bladders are commercially available from Paratech of Frankfort, Ill. under the trademark "MAXI FORCE AIR BAG".

As also shown in FIG. 4A, the test carrier 42 includes the alignment member 48 which is configured to align the components 44 on the base 46. The alignment member 48 includes a plurality of alignment openings 94 having a size and peripheral shape corresponding to the size and peripheral shape of the components 44. As shown in FIG. 4A, the alignment openings 94 have sloped sidewalls for guiding and centering the components 44, such that the contact balls 10 align with the contact members 52 on the base 46. In addition, the sloped sidewalls of the contact members 52 also perform an alignment function by centering the contact balls 10 with respect to the contact members 52.

The alignment member 48 can comprise a separate plate attached to the base 46 using an adhesive. Suitable materials for forming the alignment member 48 include silicon, ceramic, plastic, glass filled resin and photosensitive glass. With these materials the alignment openings 94 can be etched, machined or molded with a desired size and peripheral shape and then attached to the base 46.

Rather than being a separate plate, the alignment member 48 and base 46 can comprise a unitary structure formed using a process such as molding. In addition, the alignment member 48 can comprise a polymer material deposited on the base 46, etched to form the alignment openings 94, and then cured. One suitable polymer material comprises a thick film resist sold by Shell Chemical under the trademark "EPON RESIN SU-8". The resist includes an organic solvent (e.g., gamma-butyloracton), and a photoinitiator. A conventional resist coating apparatus, such as a spin coater, or a meniscus coater, along with a mask or stencil, can be used to deposit the resist in viscous form onto the base 46. The deposited resist can then be partially hardened by heating to about 95° C. for about 15 minutes or longer. Following partial hardening, the resist can be developed and etched to form the alignment openings 94, and then fully hardened by heating to about 95° C. for about an hour.

Figure 5:
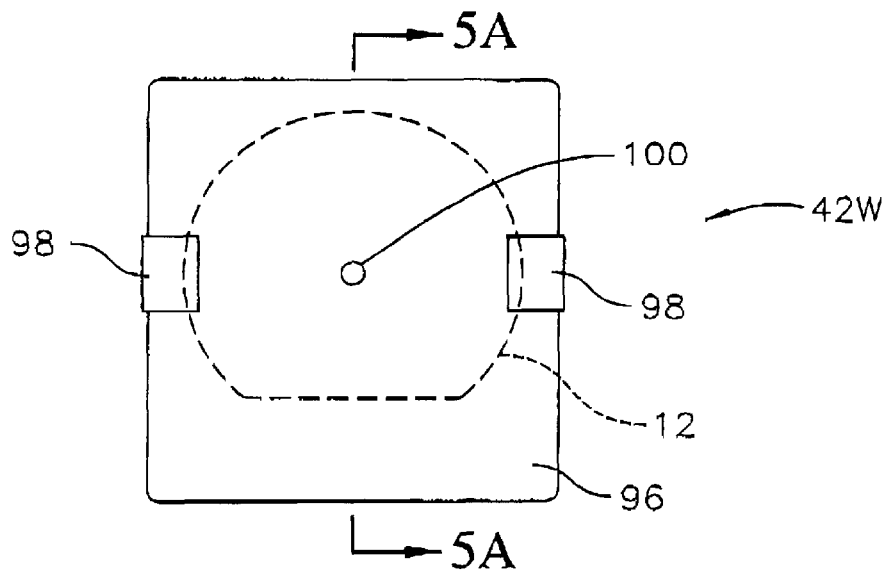
FIG. 5 is a plan view of an alternate embodiment wafer test carrier constructed in accordance with the invention.
Figure 5A:
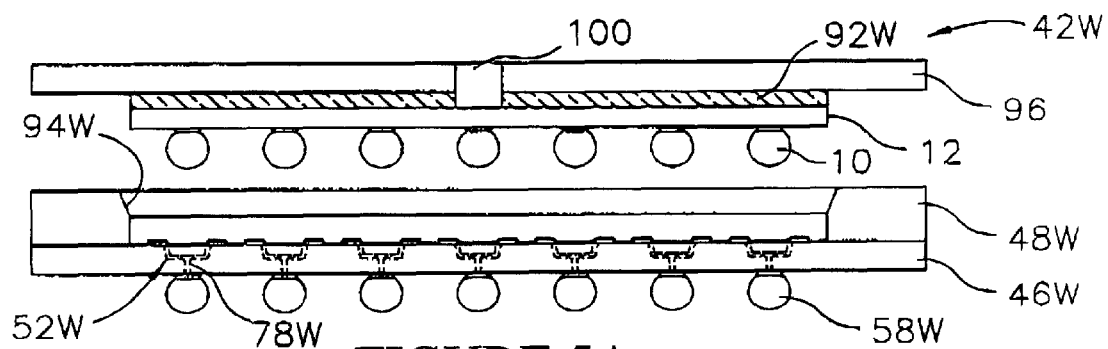
FIG. 5A is a schematic cross sectional view of the wafer test carrier taken along section line 5A—5A of FIG. 5.

Referring to FIGS. 5 and 5A, an alternate embodiment test carrier 42W is illustrated. The test carrier 42W is configured to temporarily package the bumped semiconductor wafer 12 for testing. The test carrier 42W comprises a base 46W, an elastomeric spring member 92W, an alignment member 48W, and a cover 96.

The base 46W includes contact members 52W, conductive vias 78W, and terminal contacts 58W which are substantially equivalent to the corresponding elements of test carrier 42 previously described. In addition, the alignment member 48W includes an alignment opening 94W which functions substantially as previously described for opening 94 on alignment member 48.

However, in this embodiment the elastomeric spring member 92W is attached to the cover 96 using an adhesive, such as silicone. In addition, the elastomeric spring member 92W and cover 96 include a vacuum opening 100. The vacuum opening 100 can be used to apply a vacuum to the wafer 12 for holding the wafer 12 against the elastomeric spring member 92W during assembly of the test carrier 42W. In addition, clips 98 are provided for securing the cover 96 to the base 46W.

Figure 6:
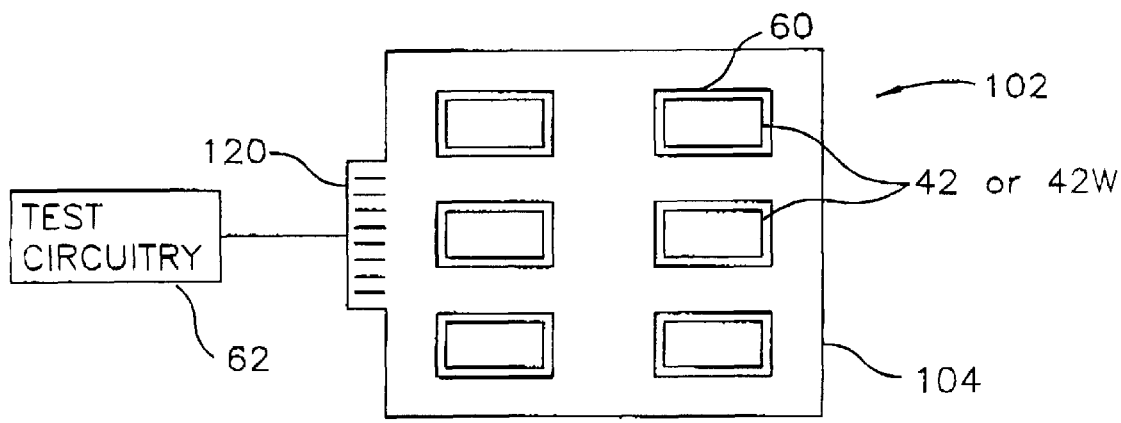
FIG. 6 is a schematic plan view of a test system employing test carriers constructed in accordance with the invention.

Referring to FIG. 6, a test system 102 incorporating test carriers 42 assembled with components 44, or test carrier 42W assembled with wafer 12, is illustrated. The test system 102 comprises a test board 104 on which multiple test sockets 60 are mounted. Each socket 60 is in electrical communication with test circuitry 62 and is configured to retain and electrically engage a test carrier 42 or 42W.

The test board 104 can be formed of an electrically insulating material such as ceramic, glass filled resin, or polyimide. In addition, the test board 104 can include an edge connector 120 electrically connectable to the test circuitry 62. The test board 104 can also include electrical paths in the form of conductive traces (not shown) adapted for electrical communication with the sockets 60 and edge connector 120.

The test circuitry 62 can be configured to test electrical parameters such as input and output voltages, capacitances, and currents for the integrated circuits contained on the components 44 or wafer 12. In the case of components 44 or wafers 12 having memory devices, the test circuitry 62 can also perform logic tests wherein data storage, retrieval capabilities and response times are measured. The test circuitry 62 can be in the form of conventional test circuitry manufactured by Teradyne, Advancetest, Hewlett Packard and others.

Figures 6A, 6B:
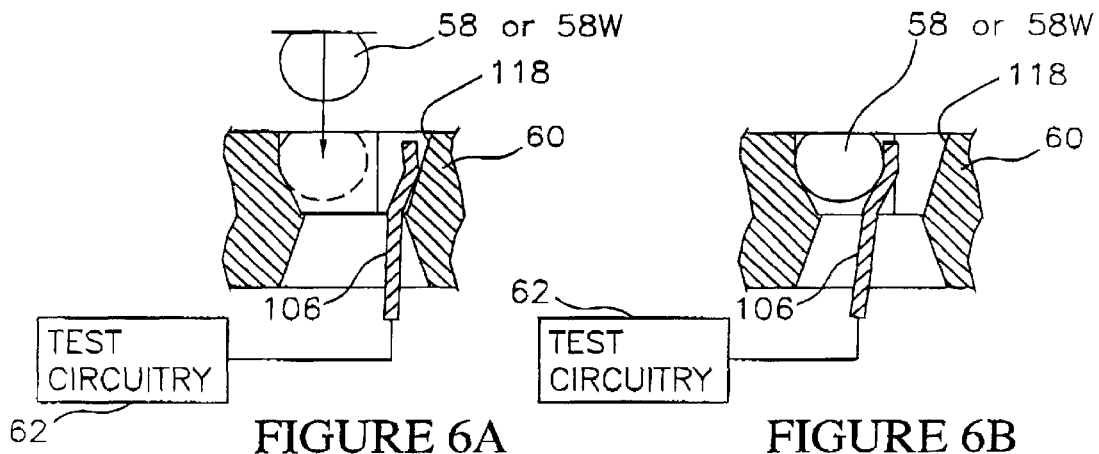
FIG. 6A is a cross sectional view of an electrical connector on a test socket of the test system prior to electrical engagement of a terminal contact on the test carriers.
FIG. 6B is a cross sectional view equivalent to FIG. 6A showing the electrical connector electrically engaging the terminal contact.

Referring to FIGS. 6A and 6B, terminal contact 58 on test carrier 42 (FIG. 4A), or alternately terminal contact 58W on wafer carrier 42W (FIG. 5), are shown electrically engaging test socket 60. The test socket 60 includes pockets 118 which match the pattern of the terminal contacts 58 or 58W on the test carrier 42 or 42W. An electrical connector 106 is mounted within each pocket 118. The electrical connectors 106 are in electrical communication with test circuitry 62. As shown in FIG. 6A, the pocket 118 receives the terminal contact 58 or 58W with the electrical connector 106 in an unactuated position and with a zero insertion force. As shown in FIG. 6B, actuation of the electrical connector 106 presses the connector 106 against the terminal contact 58. The electrical connector 106 can be actuated by a cam, or a lever, as is known in the art. This type of connector 106 is adapted to exert a wiping action which breaks through oxide layers on the terminal contacts 58 or 58W. This type of socket and connector suitable for use with ball grid array devices is manufactured by Plastronics of Irving, Tex.

Since the terminal contacts 58 or 58W are formed of a hard metal, wear and deformation are low, even with multiple uses of the test carriers 42 or 42W. In addition, low resistance electrical connections can be made because the terminal contacts 58, 58W can include non-oxidizing layers (e.g., 64-FIG. 4I) or alternately can be formed of metals that do not oxidize as easily as solder.

Figure 7:
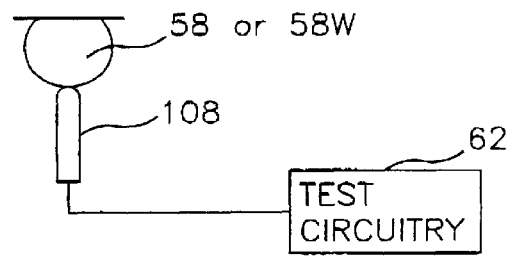
FIG. 7 is a schematic view of an alternate embodiment electrical connector electrically engaging the terminal contact.

Referring to FIG. 7, electrical engagement of the terminal contacts 58 or 58W can also be performed using spring loaded pins 108, such as "POGO PINS" manufactured by Pogo Industries, Kansas City, Kans. In this case, because the terminal contacts 58 or 58W are formed of a hard metal, wear and deformation are again low.

Figure 8:
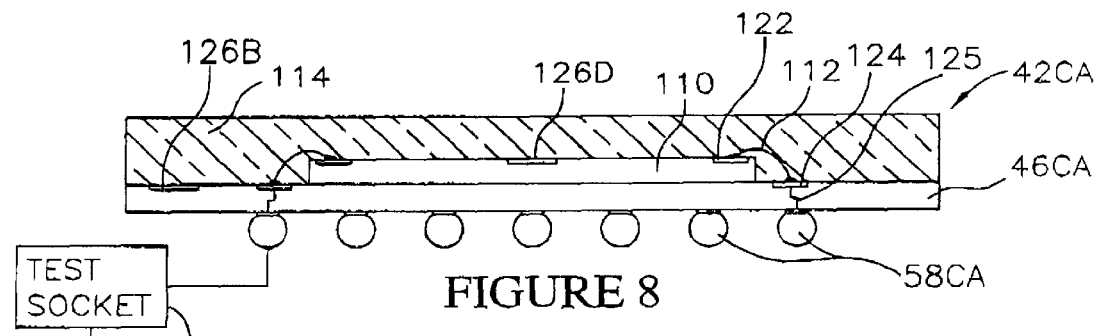
FIG. 8 is a schematic cross sectional view of a calibration carrier constructed in accordance with the invention.

Referring to FIG. 8, an alternate embodiment calibration carrier 42CA is illustrated. The calibration carrier 42CA is configured for insertion into a conventional test socket 60C of a conventional test system 102C. The conventional test socket 60C and test system 102C can be similar to test socket 60 (FIG. 6) and test system 102 (FIG. 6), but are configured to test conventional bumped components without using the test carriers 42 or 42W. The calibration carrier 42CA can be used in place of the conventional components to test individual sockets 60C of the conventional test system 102C. The calibration carrier 42CA can be configured to calibrate either wafer level test systems, or die level test systems.

The calibration carrier 42CA comprises a base 46CA having hard metal terminal contacts 58CA; a semiconductor die 110 wire bonded to the base 46CA in electrical communication with the terminal contacts 58CA; and an encapsulant 114 covering the die 110 and surface of the base.

The base 46CA can be formed substantially as previously described for base 46. The size and peripheral outline of the base 46CA, and the pattern of the terminal contacts 58CA matches the size and pattern of the conventional components (e.g., wafers, dice, chip scale packages, BGA devices) of the test system 102C being calibrated. The terminal contacts 58CA can be formed substantially as previously described for terminal contacts 58, 58A, 58B or 58W.

The die 110 can include integrated circuits that are substantially similar to the integrated circuits contained in the conventional components. The die 110 can also include evaluation circuits 126D configured to evaluate selected electrical characteristics of the socket 60C and test system 102C. Electrical communication between the die 110 and the terminal contacts 58CA can be through wires 112 bonded to contacts 122 on the die 110 (e.g., bond pads), and to corresponding contacts 124 on the base 46CA.

The base 46CA can include internal conductors 125 that provide conductive paths between the contacts 124 and the terminal contacts 58CA. In addition, the base 46CA can include evaluation circuits 126B configured to evaluate selected electrical characteristics of the socket 60C and test system 102C. The evaluation circuits 126B can be in electrical communication with selected terminal contacts 58CA.

The encapsulant 114 can comprise a deposited and cured polymer such as epoxy, silicone, room temperature vulcanizing (RTV) material, or polyimide. Suitable compounds are commercially available from Dexter/Hysol and from Thermoset. Preferably, a combined thickness of the encapsulant 114 and base 46CA matches the thickness of the conventional component. A size and outline of the calibration carrier 42CA thus substantially matches that of the conventional component being simulated by the calibration carrier 42CA.

With the base 46A placed in the conventional test socket 60C in place of the conventional component, test signals can be transmitted to the die 110 and the resultant signals analyzed. Because the terminal contacts 58CA comprise a hard metal, deformation of the contacts is substantially reduced. In addition, because non-oxidizing materials can be used to form the terminal contacts 58CA, low resistance electrical connections with the test socket 60C are facilitated.

Thus the electrical characteristics of the socket 60C and test system 102C can be evaluated without variables, such as high contact resistance, being introduced by deformed or oxidized solder balls. If a high contact resistance is measured, this can indicate dirty, oxidized, deformed, or misaligned electrical connectors 106 (FIG. 6B) or 108 (FIG. 7) on the conventional test socket 60C. The calibration carrier 42CA can also be used to design new test systems and to facilitate design changes (e.g., signal routing) for existing test systems.

Figure 8A:
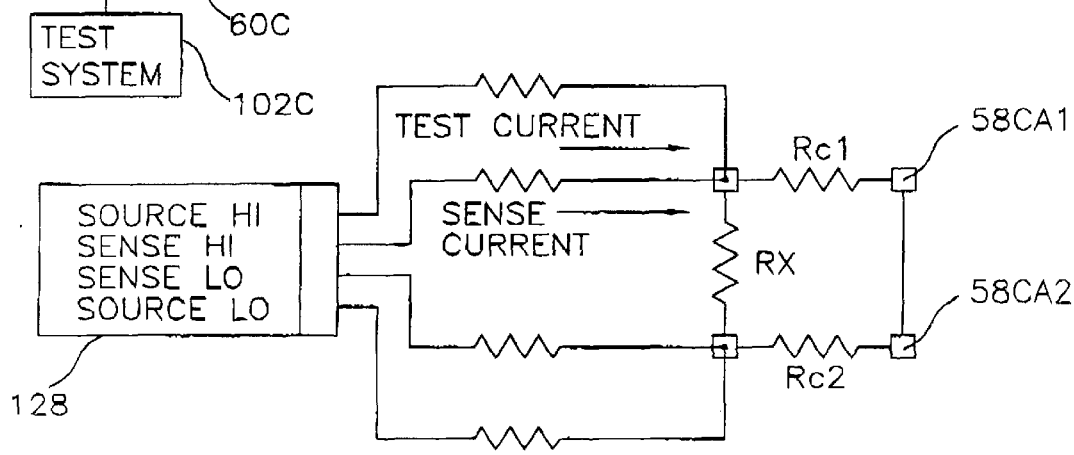
FIG. 8A is a schematic electrical diagram of a resistivity measuring circuit associated with the calibration carrier of FIG. 8.

Referring to FIG. 8A, a representative circuit that can be included in the evaluation circuitry 126B or 126D comprises a resistivity measuring circuit 128. The resistivity measuring circuit 128 can also be included in a conventional digital multimeter contained within the conventional test system 102C. This type of multimeter is commercially available from Keithley Instruments, Cleveland, Ohio, and other instrument manufacturers.

The resistivity measuring circuit 128 evaluates a total resistance $R_x$ of the electrical path between selected terminal contact 58CA which are designated resistivity terminal contacts 58CA1, 58CA2. A high value for $R_x$ can indicate a high contact resistance between the terminal contacts 58CA and electrical connectors 106 (FIG. 6B) or spring loaded pins 108 (FIG. 7) on the test socket 60C, such as would occur with dirty, oxidized, deformed, or misaligned connectors.

With this arrangement, an unknown resistance $R_x$ (FIG. 6B) between the resistivity contacts 58CA1, 58CA2 can be measured by applying a test current from source terminals (source Hi, source Lo) through a known resistance $R_L$ to the resistivity contacts 58CA1, 58CA2. In addition, a sense current can be applied from sense terminals (sense Hi, sense Lo) through known resistances to the resistivity contacts 58CA1, 58CA2. The sense current is very low (e.g., picoamps) such that the I-R drop is low and the voltage seen by the sense terminals (sense Hi, sense Lo) is the same as the voltage developed across $R_x$. This enables $R_x$ to be quantified and evaluated.

With the calibration carrier 42CA placed in the test socket 60C, the contact resistances (Rc1 and Rc2) between the resistivity contacts 58CA1, 58CA2 and their associated electrical connectors 106 or 108 on the test socket 60C is a major component of the resistance $R_x$. Accordingly, a high value for $R_x$ may indicate that the electrical connectors 106 or spring loaded pins 108 are dirty, oxidized, deformed, or misaligned. In some applications the test signals to selected electrical connectors 106 or spring loaded pins 108 can be adjusted (e.g., voltage increased) to compensate for variations in the connectors. For other applications, the sockets 60C can be replaced or repaired.

FIG. 8B summarizes steps in a method for calibrating the test system 102C using the calibration carrier 42CA.

1. Provide calibration carrier 42CA having hard metal terminal contacts 58CA and semiconductor die 110.
2. Place calibration carrier 42CA in test socket 60C of test system 102C to simulate conventional component under test having solder balls.
3. Transmit test signals and analyze resultant signals from semiconductor die 110 contained in calibration carrier 42CA.
4. Use this data as a "standard" for calibrating test system 102C, or to indicate defective electrical connectors 106, 108.
5. Optionally, provide evaluation circuits 126B, 126D, on calibration carrier 42CA, such as resistivity measuring circuit 128.
6. Evaluate electrical characteristics, such as contact resistance between test socket 60C and terminal contacts 58CA, using evaluation circuits 126B, 126D.
7. Adjust test signals, or clean and repair test socket, based on evaluation.

Figure 9:
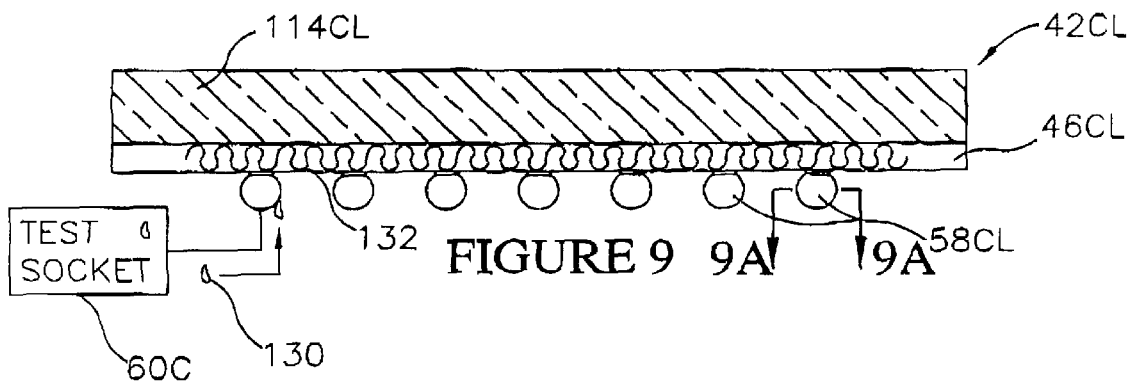
FIG. 9 is a schematic cross sectional view of a cleaning carrier constructed in accordance with the invention.
Figure 9A:
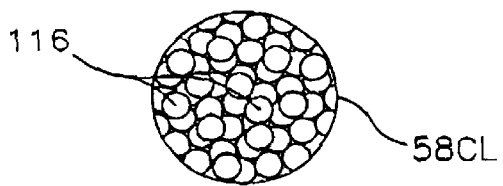
FIG. 9A is a cross sectional view taken along section line 9A—9A of FIG. 9 illustrating a cleaning contact on the cleaning carrier.

Referring to FIGS. 9 and 9A, a cleaning carrier 42CL is illustrated. The cleaning carrier 22CL comprises a base 46CL and an encapsulant 114CL. For some applications the encapsulant 114CL can be omitted. However, in the illustrative embodiment the encapsulant 114CL is provided to give the cleaning carrier 42CL a size and peripheral outline which are equivalent to a conventional bumped semiconductor component.

The base 46CL also includes terminal contacts 58CL formed of a solder wettable material. One suitable solder wettable material comprises pressed and sintered balls 116 formed into spherically shaped terminal contacts 58CL having the size of conventional solder balls. Rather than a pressed and sintered material, braided metal wires formed into a desired configuration, can be used. Suitable solder wettable materials include copper and gold.

The base 46CL can comprise ceramic, plastic, glass resin or metal. The base 46CL can also include a heating element 132 for heating the terminal contacts 58CL. For example, the heating element 132 can be heated by applying a current thereto prior to placement in the test socket 60C. Alternately the heating element 132 can be in electrical communication with selected terminal contacts 58CA and can be heated in place in the test socket 60C. As another alternative the socket 60C can be contained in a burn-in oven having a heat source.

The cleaning carrier 42CL is configured for placement in a conventional test socket 60C substantially as previously described for calibration carrier 42CA. With the cleaning carrier 24CL placed in the test socket 60C, solder contaminants 130 within the test socket 60C are attracted to the terminal contacts 58CL. In addition, the solder contaminants temporarily bond to the terminal contacts 58CL, and can be removed from the socket 60C with the cleaning carrier 42CL. A representative heating temperature for the terminal contacts 58CL can be from 183° C. to 260° C.

Figure 9B:
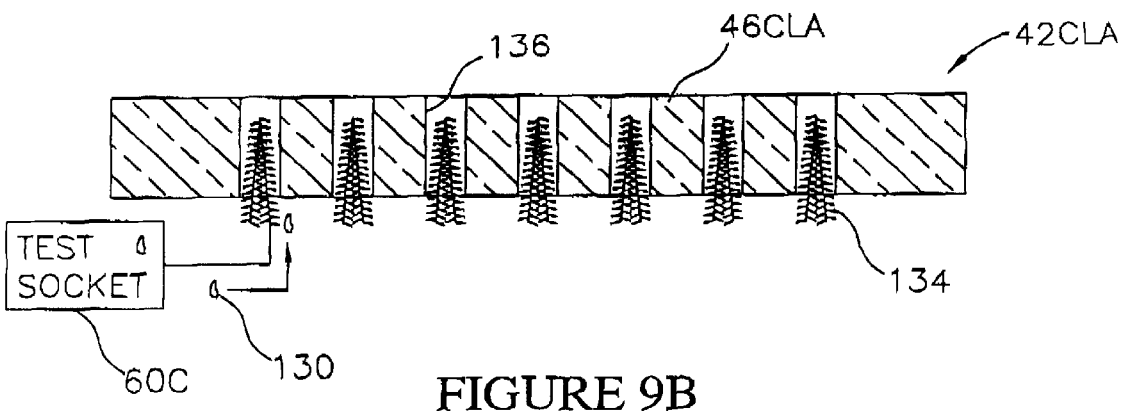
FIG. 9B is a schematic cross sectional view equivalent to FIG. 9 of an alternate embodiment cleaning carrier.

FIG. 9B illustrates an alternate embodiment cleaning carrier 42CLA. The cleaning carrier 42CLA comprises a base 46CLA and bristle members 134. The bristle members 134 functions substantially as previously described terminal contacts 58CL (FIG. 9). The bristle members 134 can comprise strands, or wires, of copper or gold, pressed into openings 136 in the base 46CLA. Alternately the bristle members 134 can comprise a pressed and sintered material that is pressed into the openings 136 to form columns. The base 46CLA can comprise ceramic, plastic, glass filled resin or metal. If the base 46CLA is made of metal, a current can be passed therethrough for heating the bristle members 134. Heating can also be by induction.

Figure 9C:
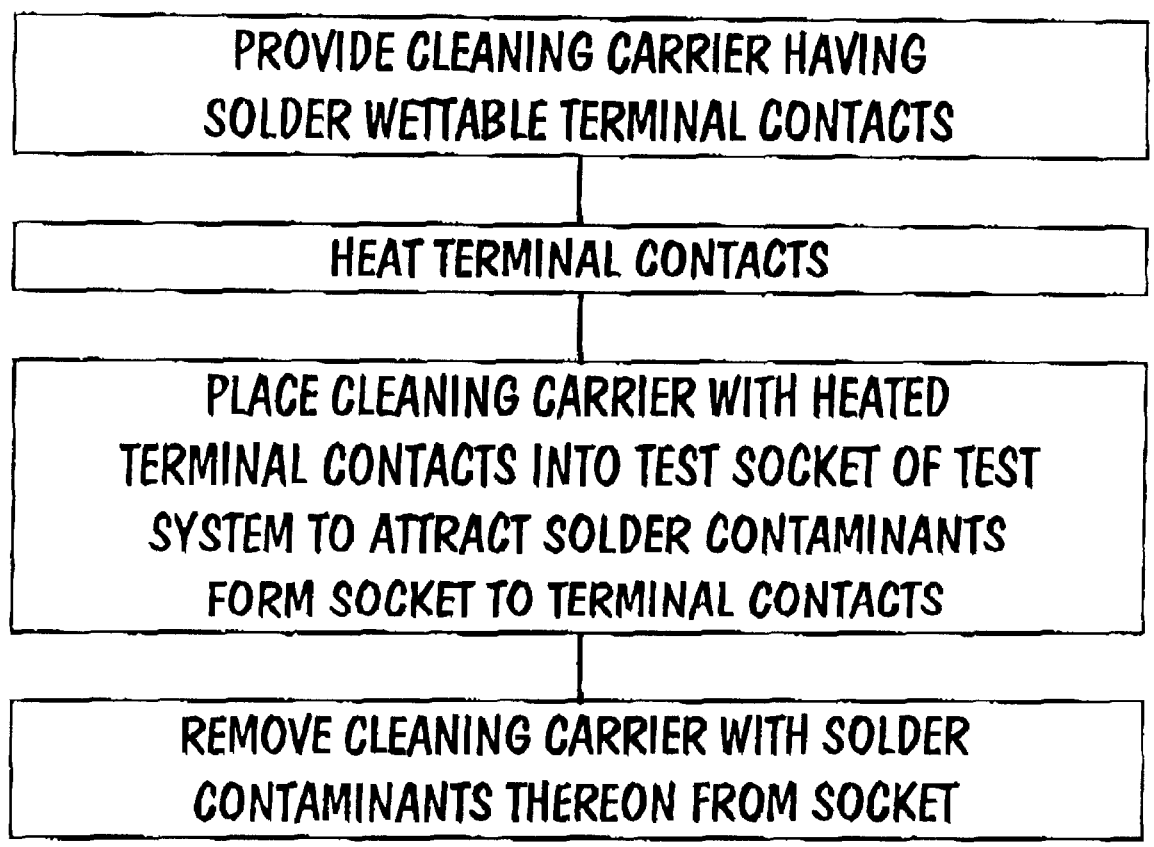
FIG. 9C is a block diagram illustrating steps in a method for cleaning a test system using the cleaning carrier of FIG. 9 or FIG. 9B.

FIG. 9C summarizes steps in a method for cleaning a test system using the cleaning carrier 42CL (or alternately the cleaning carrier 42CLA).

1. Provide cleaning carrier having solder wettable terminal contacts.
2. Heat terminal contacts.
3. Place cleaning carrier with heated terminal contacts into test socket of test system to attract solder contaminants from socket to terminal contacts.
4. Remove cleaning carrier with solder contaminants thereon from socket.

Thus the invention provides an improved test carrier for testing bumped semiconductor components, a calibration carrier for calibrating semiconductor test systems, and a cleaning carrier for cleaning semiconductor test systems. Also provided are improved methods for testing semiconductor components and for calibrating and cleaning semiconductor test systems.

While the invention has been described with reference to certain preferred embodiments, as will be apparent to those skilled in the art, certain changes and modifications can be made without departing from the scope of the invention as defined by the following claims.

What is claimed is:

1. A carrier for calibrating a test system for a semiconductor component having contact balls comprising:
    a base having a peripheral outline substantially similar to the component;
    a semiconductor die on the base;
    a plurality of terminal contacts on the base in electrical communication with the die, the terminal contacts arranged in a pattern substantially similar to the contact balls on the component, each terminal contact comprising a wear resistant metal configured for multiple electrical engagements with an electrical connector on a test socket of the test system without substantial deformation; and
    an electrical circuit on the base or the die configured to evaluate an electrical characteristic of the test system.

2. The carrier of claim 1 wherein the wear resistant metal comprises a metal selected from the group consisting of nickel, copper, beryllium copper, alloys of nickel, alloys of copper, alloys of beryllium copper, nickel-cobalt-iron alloys, iron-nickel alloys, gold, silver and palladium.

3. The carrier of claim 1 wherein each terminal contact comprises glass.

4. The carrier of claim 1 wherein the electrical circuit comprises a resistance measuring circuit.

5. A carrier for calibrating a test system for a semiconductor component having contact balls comprising:
    base having a peripheral outline 'substantially similar to the component;
    a semiconductor die on the base;
    a plurality of terminal contacts on the base in electrical communication with the die, the terminal contacts arranged in a pattern substantially similar to the contact balls on the component, each terminal contact comprising a wear resistant metal configured for multiple electrical engagements with an electrical connector on a test socket of the test system without substantial deformation; and
    a resistance measuring circuit on the base or the die configured to evaluate a contact resistance between a selected terminal contact and a selected electrical connector on the test system.

6. The carrier of claim 5 wherein the component comprises an element selected from the group consisting of dice, wafers, chip scale packages and ball grid array devices.

7. A carrier for calibrating a test system for a component having contact balls comprising:
    a base having a peripheral outline substantially similar to the component;
    a semiconductor die on the base;
    a plurality of terminal contacts on the base in electrical communication with the die configured for multiple electrical engagements with a test socket of the test system without substantial deformation; and
    a resistivity measuring circuit on the die, or on the base, configured to evaluate a contact resistance between a selected terminal contact on the carrier and a selected electrical connector on the test system.

8. The carrier of claim 7 wherein the resistivity measuring circuit utilizes a test current and a sense current.

9. The carrier of claim 7 wherein the component comprises an element selected from the group consisting of dice, wafers, chip scale packages, and ball grid array devices.

10. A method for calibrating a test system for a semiconductor component having contact balls comprising:
    providing a calibration carrier for stimulating the component during testing, the carrier comprising a base, a semiconductor die on the base, a plurality of terminal contacts on the base for electrically contacting a plurality of electrical connectors of the test system without substantial deformation, and an evaluation circuit configured to evaluate an electrical characteristic of the test system;
    placing the terminal contacts and the electrical connectors in electrical contact;
    transmitting test signals to the die and analyzing resultant signals; and
    adjusting the test signals, or cleaning or repairing the test system using information from the evaluation circuit.

11. The method of claim 10 wherein the terminal contacts comprise a metal selected from the group consisting of nickel, copper, beryllium copper, alloys of nickel, alloys of copper, alloys of beryllium copper, nickel-cobalt-iron alloys, iron-nickel alloys, gold, silver and palladium.

12. The method of claim 10 wherein the terminal contacts comprise glass, ceramic or plastic members at least partially covered with a conductive material.

13. The method of claim 10 wherein the component comprises an element selected from the group consisting of dice, wafers, chip scale packages, and ball grid array devices.

14. A method for calibrating a test system for a semiconductor component having contact balls comprising:

providing a calibration carrier for simulating the component during testing, the carrier comprising a base, a semiconductor die on the base, and a plurality of terminal contacts on the base for electrically engaging electrical connectors of the test system without substantial deformation;

providing an evaluation circuit on the base, or on the die, configured to evaluate an electrical characteristic of the test system;

placing the terminal contacts and the electrical connectors in electrical contact;

transmitting test signals to the die and evaluating the electrical characteristic; and adjusting the test signals, or cleaning or repairing the test system based on the evaluating step.

15. The method of claim 14 wherein the evaluation circuit comprises a resistance measuring circuit.

16. The method of claim 14 wherein the evaluation circuit comprises a resistance measuring circuit for measuring a contact resistance between a selected electrical connector and a selected terminal contact.

17. The method of claim 14 wherein the terminal contacts comprise a metal selected from the group consisting of nickel, copper, beryllium copper, alloys of nickel, alloys of copper, alloys of beryllium copper, nickel-cobalt-iron alloys, iron-nickel alloys, gold, silver and palladium.

18. The method of claim 14 wherein the terminal contacts comprise glass, ceramic or plastic members at least partially covered with a conductive material.

19. The method of claim 14 wherein the component comprises an element selected from the group consisting of dice, wafers, chip scale packages, and ball grid array devices.

* * * * *